United States Patent
Tamiya

(10) Patent No.: US 12,174,525 B2
(45) Date of Patent: *Dec. 24, 2024

(54) LIGHT SHIELDING BLADE AND IMAGE PICKUP APPARATUS

(71) Applicant: CANON KABUSHIKI KAISHA, Tokyo (JP)

(72) Inventor: Hirotomo Tamiya, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/882,134

(22) Filed: Aug. 5, 2022

(65) Prior Publication Data

US 2022/0373860 A1    Nov. 24, 2022

Related U.S. Application Data

(63) Continuation of application No. 17/195,411, filed on Mar. 8, 2021, now Pat. No. 11,435,647.

(30) Foreign Application Priority Data

Mar. 19, 2020    (JP) .................................. 2020-048569

(51) Int. Cl.
*G03B 9/22*    (2021.01)
*B32B 7/12*    (2006.01)
(Continued)

(52) U.S. Cl.
CPC .................. *G03B 9/22* (2013.01); *B32B 7/12* (2013.01); *B32B 15/016* (2013.01);
(Continued)

(58) Field of Classification Search
CPC .... G03B 9/08; G03B 9/22; G03B 9/36; C23C 14/20
See application file for complete search history.

(56) References Cited

U.S. PATENT DOCUMENTS 3,636,846 A * 1/1972 Singer ...................... G03B 9/08
                                                          396/447
4,482,231 A * 11/1984 Kato ........................ G03B 9/18
                                                          396/458
(Continued)

FOREIGN PATENT DOCUMENTS

| CN | 104760344 A | * | 7/2015 | ............. B32B 15/08 |
| JP | S58149030 A |   | 9/1983 |                          |

(Continued)

OTHER PUBLICATIONS

Goldberg, Norman, Camera Technology The Dark Side of the Lens, Academic Press, Inc., Jacket Cover, pp. 59, 202 (Year: 1992).*

(Continued)

*Primary Examiner* — Christopher E Mahoney
(74) *Attorney, Agent, or Firm* — Canon U.S.A., Inc. I.P. Division

(57) ABSTRACT

A light shielding blade including a laminate in which a resin layer is sandwiched between two metal base materials, wherein the two metal base materials each have a specific rigidity of $20\times10^6$ [Pa·m$^3$/kg] or more and a specific bending rigidity of 1.0 [Pa$^{1/3}$·m$^3$/kg] or more, and wherein the resin layer has an elastic modulus of 1 GPa or more and a thickness of 65 μm or less.

17 Claims, 8 Drawing Sheets

(51) Int. Cl.
  *B32B 15/01*   (2006.01)
  *G03B 9/08*    (2021.01)
  *G03B 9/36*    (2021.01)
  *H04N 23/55*   (2023.01)
  *C23C 14/20*   (2006.01)

(52) U.S. Cl.
  CPC .............. *B32B 15/017* (2013.01); *G03B 9/08* (2013.01); *G03B 9/36* (2013.01); *H04N 23/55* (2023.01); *B32B 2255/06* (2013.01); *B32B 2255/26* (2013.01); *B32B 2307/546* (2013.01); *B32B 2307/72* (2013.01); *B32B 2307/732* (2013.01); *C23C 14/20* (2013.01)

(56) References Cited

U.S. PATENT DOCUMENTS

| | | | | |
|---|---|---|---|---|
| 5,905,920 | A * | 5/1999 | Hasuda | G03B 7/093 |
| | | | | 396/536 |
| 10,975,253 | B2 * | 4/2021 | Nagahama | G02B 1/12 |
| 11,435,647 | B2 * | 9/2022 | Tamiya | B32B 7/12 |
| 2009/0284647 | A1 * | 11/2009 | Yanai | H04N 5/2256 |
| | | | | 348/E5.022 |
| 2011/0164297 | A1 * | 7/2011 | Abe | C23C 14/0036 |
| | | | | 359/227 |
| 2015/0192836 | A1 * | 7/2015 | Matsuda | G03B 9/42 |
| | | | | 428/113 |
| 2019/0049819 | A1 * | 2/2019 | Tokiwa | G03B 17/02 |

FOREIGN PATENT DOCUMENTS

| | | | |
|---|---|---|---|
| JP | S58169136 A | 10/1983 | |
| JP | S59055419 A | 3/1984 | |
| JP | 2014235196 A * | 12/2014 | |
| WO | WO-2016186098 A1 * | 11/2016 | ............... B05D 5/06 |

OTHER PUBLICATIONS

Printout of https://www.sonelastic.com/en/fundamentals/tables-of-materials-properties/polymers.html (Year: 2023).*

Sonelastic "Modulus of elasticity and Poisson's coefficient of polymeric materials," webpage <https://www.sonelastic.com/en/fundamentals/tables-of-materials-properties/polymers.html>, 2 pages, Jun. 16, 2018,.*

[item U continued] retrieved from Internet Archive Wayback Machine <https://web.archive.org/web/20180616211045/https://www.sonelastic.com/en/fundamentals/tables-of-materials-properties/polymers.html> on Apr. 19, 2024) (Year: 2018).*

* cited by examiner

LIGHT SHIELDING BLADE AND IMAGE PICKUP APPARATUS

CROSS-REFERENCE TO RELATED APPLICATION

This application is a Continuation of U.S. application Ser. No. 17/195,411, filed Mar. 8, 2021, which claims priority from Japanese Patent Application No. 2020-048569, filed Mar. 19, 2020, each of which are hereby incorporated by reference herein in their entireties.

BACKGROUND OF THE INVENTION

Field of the Invention

The present disclosure relates to a light shielding blade and an image pickup apparatus.

Description of the Related Art

Currently, shutter blades for focal plane shutters to be used in single-lens reflex cameras are roughly classified into metal blades and resin blades. When the shutter blade becomes heavier, the driving force for driving a shutter is increased to increase the power consumption. Meanwhile, when the rigidity of the shutter blade is insufficient, the shutter blade greatly vibrates at the time of a shutter operation, and the settling time until the shutter blade is restored to a normal state thereof and dust on a sensor increase, with the result that a shutter speed cannot be increased. Accordingly, there is a demand for a lightweight shutter blade having high rigidity.

Further, a blade material that receives light for a long period of time as in a mirrorless camera may be required to have sufficient heat resistance, and a blade having a resin layer on a surface thereof or a resin blade cannot be used in some cases. Accordingly, there has been known a heat-resistant light shielding film having a Ni-based metal film and a Ni-based metal oxide film on each side of a resin film (Japanese Patent Application Laid-Open No. 2014-235196). The heat-resistant light shielding film is produced by forming a metal film on the surface of the resin film by a sputtering method.

SUMMARY OF THE INVENTION

According to a first aspect of the present disclosure, there is provided a light shielding blade including a laminate in which a resin layer is sandwiched between two metal base materials, wherein the two metal base materials each have a specific rigidity of $20 \times 10^6$ [Pa·m$^3$/kg] or more and a specific bending rigidity of 1.0 [Pa$^{1/3}$·m$^3$/kg] or more, and wherein the resin layer has an elastic modulus of 1 GPa or more and a thickness of 65 μm or less.

Further features of the present disclosure will become apparent from the following description of exemplary embodiments with reference to the attached drawings.

DESCRIPTION OF THE EMBODIMENTS

A related-art shutter, which has a large sensor for a full size and is driven at a high speed of 1/8,000 second, receives a large impact when stopped, and the vibration of a shutter blade is also large. Accordingly, a brake mechanism is adopted for the purpose of alleviating an impact in many cases. However, in order to achieve an inexpensive camera reduced in size and weight, there is a demand for a simple shutter configuration in which the brake mechanism is reduced, and the shutter is brought into abutment with a member such as a rubber to be stopped when the operation of the shutter is stopped. In order to use the shutter blade disclosed in Japanese Patent Application Laid-Open No. 2014-235196 in such application, it is required to increase a metal layer in thickness to obtain rigidity. However, in this case, the film forming time of the metal layer is prolonged to increase cost, and hence it is substantially difficult to achieve the thickness for suppressing vibration.

Figure 1:
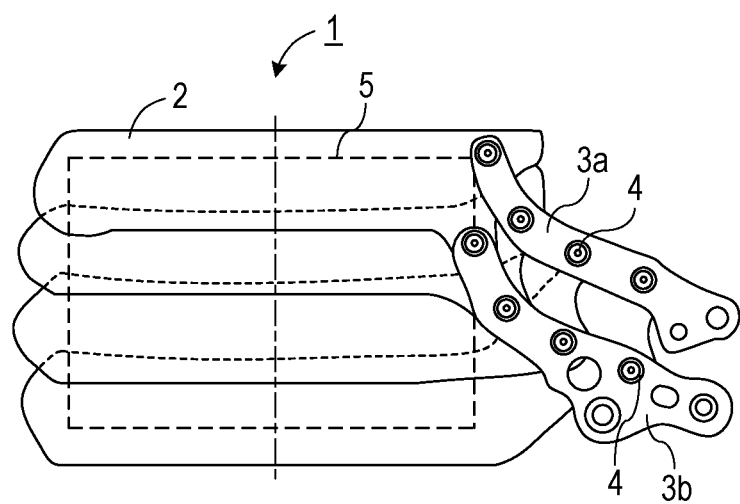
FIG. 1 is a schematic view for illustrating a configuration example of a shutter blade.

A configuration of a shutter blade is illustrated in FIG. 1. In FIG. 1, there is illustrated an opening 5 of an image pickup apparatus or the like, and a shutter blade 1 is used for shielding light entering the opening 5. The shutter blade 1 includes a plurality of light shielding blades 2. In each of the light shielding blades 2, one side thereof is fixed to blade arms 3a and 3b with a caulking pin 4 and a distal end portion thereof on an opposite side is not restrained in the form of a cantilever. In the shutter blade 1 having such configuration, the light shielding blade 2 receives an impact from a sectional direction when the operation of a shutter is stopped. In this case, vibration is transmitted from an end side of the light shielding blade 2 fixed to the blade arms 3a and 3b with the caulking pin 4, and the amplitude of the vibration increases toward the distal end thereof on the opposite side. In addition, the amplitude becomes larger as the warpage of the light shielding blade 2 in a direction perpendicular to a thickness direction from the fixed side is larger.

The inventor of the present disclosure has focused on the specific rigidity and the specific bending rigidity of a metal material and the image stabilizing effect of a resin layer in a laminate in which the resin layer is sandwiched between two metal base materials. As a result, the inventor of the present disclosure has found that, when the resin layer is formed at an interface between metal materials each having high specific rigidity and high specific bending rigidity, even the thin resin layer can absorb shear strain between the metal base materials generated by an impact at the time of stopping, to thereby achieve the present disclosure. Now, an embodiment of the present disclosure is described.

Figure 2:
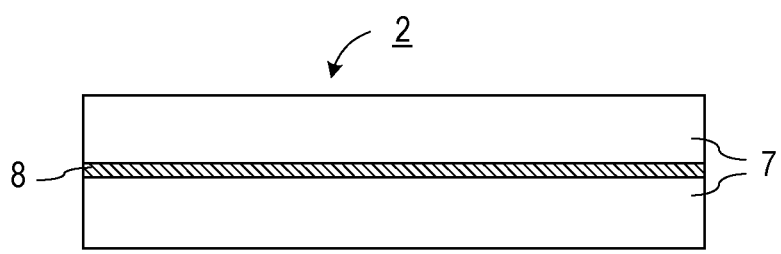
FIG. 2 is a schematic sectional view of a light shielding blade of the present disclosure in a thickness direction.

A light shielding blade of the present disclosure is used as the light shielding blade 2 of the shutter blade 1 of FIG. 1. FIG. 2 is a schematic sectional view of the light shielding blade of the present disclosure in a thickness direction. The light shielding blade 2 of the present disclosure is a laminate including two metal base materials 7 and a resin layer 8 sandwiched between the two metal base materials 7. Now, each member is described.

(Metal Base Materials)

As each of the metal base materials 7, first, it is required to select a material that reduces initial deflection and a decentering amount caused by own-weight in order to reduce the amplitude of vibration, and a material having a specific rigidity of $20 \times 10^6$ [Pa·m$^3$/kg] or more is selected. Then, in order to allow each of the metal base materials 7 to withstand a load generated by an impact and reduce vibration, it is required to increase specific bending rigidity. As a shutter blade for a full size, a material having a specific bending rigidity of 1.0 [Pa$^{1/3}$·m$^3$/kg] or more, preferably 1.5 [Pa$^{1/3}$·m$^3$/kg] or more is selected.

Figure 3:
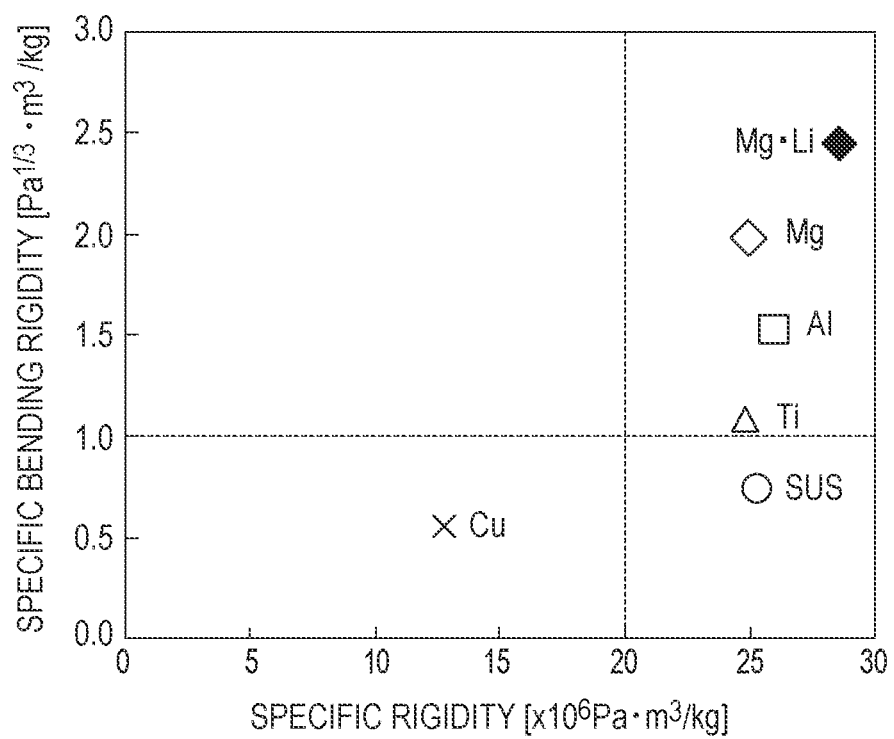
FIG. 3 is graph for showing specific rigidity and specific bending rigidity of typical metal materials.

The specific rigidity and the specific bending rigidity of typical metal materials are shown in Table 1 and FIG. 3. The specific rigidity is a value obtained by dividing an elastic modulus E [Pa] of a metal material by a density ρ [kg/m$^3$] thereof, and the specific bending rigidity is a value obtained by dividing a third root of the elastic modulus E [Pa] of the metal material by the density ρ [kg/m$^3$] thereof. The elastic modulus E and the density ρ of each metal material are also shown in Table 1. The elastic modulus E of the metal material is a value measured in accordance with JIS Z2241 "Metallic Materials Tensile Testing," and the density ρ is a value measured in accordance with JIS Z8807 "Measuring Methods for Density and Specific Gravity of Solid."

TABLE 1

| | Elastic modulus E [GPa] | Density ρ ×10$^3$ [kg/m$^3$] | Specific rigidity (E/ρ) ×10$^6$ [Pa · m$^3$/kg] | Specific bending rigidity (E$^{1/3}$/ρ) [Pa$^{1/3}$ · m$^3$/kg] |
|---|---|---|---|---|
| Al | 70 | 2.7 | 25.9 | 1.5 |
| Ti | 110 | 4.4 | 25.0 | 1.1 |
| Mg | 45 | 1.8 | 25.0 | 2.0 |
| Mg-Li | 40 | 1.4 | 28.6 | 2.4 |
| SUS | 200 | 7.9 | 25.3 | 0.7 |
| Cu | 110 | 8.6 | 12.8 | 0.6 |

As shown in Table 1 and FIG. 3, the metal materials other than Cu increase in elastic modulus substantially in proportion to the density from the viewpoint of specific rigidity, and hence these metal materials can satisfy the characteristics as the shutter blade for a full size. Meanwhile, the non-ferrous materials excluding Cu satisfy the characteristics of specific bending rigidity, and more preferably Al, Mg, Ti, or an alloy containing any one of Al, Mg, and Ti as a main component can satisfy the characteristics. An example of the alloy is Mg—Li (alloy). It is preferred that the metal material have a density ρ of $5.0 \times 10^6$ [kg/m$^3$] or less.

The preferred thickness of the metal base materials 7 is 20 μm or more and 150 μm or less in terms of a total thickness of the two base materials, and it is preferred that the two base materials have the same thickness. When the thickness is less than 20 μm, the amplitude of the light shielding blade 2 is large due to insufficient rigidity, and there is a risk in that the light shielding blade 2 is brought into contact with members on the periphery, such as a sensor, to damage the members. In addition, it is not preferred that the thickness be more than 150 μm because an excess space is occupied in a camera body on which the light shielding blade 2 is mounted. Further, it is not preferred that the thickness be more than 150 μm for the following reason: when the metal base materials 7 are too thick, the weight thereof is increased, and hence electric power required for operation is increased to increase a power consumption amount, with the result that a battery is consumed quickly.

(Resin Layer)

In the present disclosure, the resin layer 8 has an elastic modulus of 1 GPa or more, preferably 5 GPa or less. When the elastic modulus is 1 GPa or more, the light shielding blade 2 is less liable to be deformed. However, it is not preferred that the elastic modulus be more than 5 GPa because cracks are liable to be generated due to a repeated bending stress.

In addition, the resin layer 8 has a thickness of 65 μm or less, preferably 3 μm or more and 65 μm or less. As the thickness of the resin layer 8 is increased more, the vibration damping characteristics are improved more. However, when the thickness is more than 65 μm, the specific rigidity is decreased, and there is risk in that initial deflection caused by own-weight may be increased. In addition, it is not preferred that the resin layer 8 have a thickness of less than 3 μm because the volume ratio of the two metal base materials 7 in the light shielding blade 2 is increased, and a structure close to one metal plate is obtained, with the result that the vibration suppressing effect by the resin layer 8 is not easily obtained.

[Resin Material]

A material for the resin layer 8 is not particularly limited, but in the present disclosure, a cured product of an epoxy adhesive formed of an epoxy resin serving as a main agent and a crosslinking curing agent is preferably used. The epoxy resin serving as a main agent is not particularly limited as long as the epoxy resin is a material that is cured through a crosslinking polymerization reaction when used in combination with the curing agent.

Examples of the epoxy resin include: bisphenol-type epoxy resins, such as a bisphenol A-type epoxy resin and a bisphenol F-type epoxy resin; novolac-type epoxy resins, such as a novolac epoxy resin and a cresol novolac epoxy resin; and epoxy resins such as a biphenyl-type epoxy resin, a stilbene-type epoxy resin, a triphenol methane-type epoxy resin, an alkyl-modified triphenol methane-type epoxy resin, a triazine nucleus-containing epoxy resin, and a dicyclopentadiene-modified phenol-type epoxy resin.

Of those, from the viewpoint of adhesive strength, it is preferred to use an epoxy resin having a rigid structure, such as a biphenyl skeleton, a bisphenol skeleton, or a stilbene skeleton, in a main chain. In particular, bisphenol-type epoxy resins are preferably used, and of those, a bisphenol F-type epoxy resin is preferably used. This is because the bisphenol (F-type) epoxy resin has a feature in that a crosslinking density is high, and hence high mechanical strength, satisfactory chemical resistance, high curability, and small free volume are obtained, with the result that hygroscopicity becomes small.

In addition, as the crosslinking curing agent to be used in the present disclosure, those which have general versatility generally used for curing an epoxy adhesive may be used. Examples thereof include a thiol-based curing agent, an amine-based curing agent, an acid anhydride-based curing agent, and a phenol-based curing agent.

Examples of the thiol-based curing agent include: a thiol compound obtained through an esterification reaction between a polyol and a mercapto organic acid, such as trimethylolpropane tris(thioglycolate), pentaerythritol tetrakis(thioglycolate), ethylene glycol dithioglycolate, trimethylolpropane tris(β-thiopropionate), pentaerythritol tetrakis(β-thiopropionate), or dipentaerythritol poly(β- thiopropionate); an alkyl polythiol compound, such as 1,4-butanedithiol, 1,6-hexanedithiol, or 1,10-decanedithiol; a terminal thiol group-containing polyether; a terminal thiol group-containing polythioether; a thiol compound obtained through a reaction between an epoxy compound and hydrogen sulfide; and a thiol compound having a terminal thiol group obtained through a reaction between a polythiol and an epoxy compound.

Examples of the amine-based curing agent include: aliphatic polyamines, such as diethylenetriamine, triethylenetetramine, and m-xylylenediamine; aromatic polyamines, such as diaminodiphenylmethane, m-phenylenediamine, and diaminodiphenyl sulfone; and polyamine compounds including dicyandiamide and an organic acid dihydrazide.

Examples of the acid anhydride-based curing agent include: alicyclic acid anhydrides, such as hexahydrophthalic anhydride and methyl tetrahydrophthalic anhydride; and aromatic acid anhydrides, such as trimellitic anhydride and benzophenonetetracarboxylic dianhydride.

An example of the phenol-based curing agent is a phenol resin.

In addition, the curing agent may contain a curing accelerator.

[Supramolecular Inclusion Body]

Figure 4:
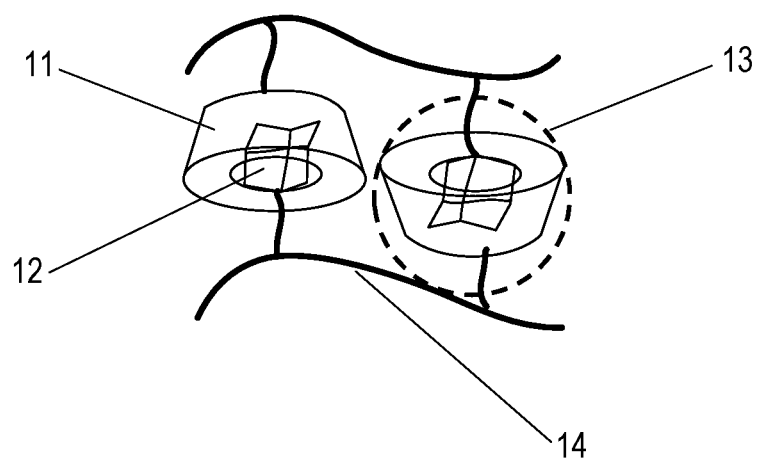
FIG. 4 is a conceptual diagram of a chemical structure of a supramolecular inclusion body used in the present disclosure.

In the present disclosure, it is preferred that the resin layer 8 be a cured product obtained by curing a composition in which a supramolecular inclusion body is contained in the epoxy adhesive. FIG. 4 is a conceptual diagram for illustrating an example of a crosslinking portion of the cured product. In FIG. 4, there are illustrated a cyclodextrin derivative 11, a guest compound (1-adamantylamine in this example) 12, a crosslinking point 13 by a non-covalent bond, and a chain polymer 14. As illustrated in FIG. 4, the crosslinking point 13 by a non-covalent bond is formed by a supramolecular inclusion body formed of the cyclodextrin derivative 11 and the guest compound 12.

In the cured product of the epoxy adhesive, a three-dimensional network structure in which chain polymers are crosslinked by crosslinking points by a covalent bond is formed in order to increase mechanical strength and the like. When a stress is applied to the cured product, the stress tends to concentrate on a short portion of the three-dimensional network (crosslinking point by a covalent bond), and hence damage is liable to occur. Once the bond of the crosslinking point by a covalent bond is broken, the bond of the crosslinking point is not restored, and hence breaking energy is low.

The cured product of the epoxy adhesive containing a supramolecular inclusion body has the crosslinking point 13 by a non-covalent bond in addition to the crosslinking point by a covalent bond. Accordingly, there is an effect that, when an external force is applied, the cyclodextrin derivative 11 serving as a host compound is separated from the guest compound 12, to thereby alleviate the concentration of a stress. Further, when the external force is removed, the separated cyclodextrin derivative 11 and the guest compound 12 form a supramolecular inclusion body again, to thereby form the crosslinking point 13 by a non-covalent bond. As described above, due to the buffer action of the crosslinking point 13 by a non-covalent bond, the cured product has a high elastic modulus and high breaking energy. That is, the cured product has increased breaking energy and improved toughness while having an elastic modulus equivalent to that of a conventional epoxy adhesive.

The supramolecular inclusion body is formed of the cyclodextrin derivative and the guest compound.

Examples of the cyclodextrin derivative include an α-cyclodextrin derivative, a β-cyclodextrin derivative, and a γ-cyclodextrin derivative. When the guest compound is adamantylamine, a β-cyclodextrin derivative is preferred as the cyclodextrin derivative.

The cyclodextrin derivative has an alkoxy group and a substituted or unsubstituted amino group. In general, a supramolecular inclusion body formed of cyclodextrin and a guest compound is chemically bonded in a hydrophilic polymer, and hence cyclodextrin is modified with hydroxy groups and has unsatisfactory compatibility with an epoxy resin. Accordingly, when at least part of the hydroxy groups of cyclodextrin are substituted with an alkoxy group and a substituted or unsubstituted amino group, the compatibility with the epoxy resin is improved. It is preferred that the cyclodextrin derivative be a compound in which a plurality of the hydroxy groups of cyclodextrin are substituted with alkoxy groups. The alkoxy group is not particularly limited, but a methoxy group is preferred from the viewpoint of the compatibility with the epoxy resin. The substituted or unsubstituted amino group is not particularly limited, but an unsubstituted amino group is preferred from the viewpoint of the reactivity with the epoxy resin.

The guest compound has a substituted or unsubstituted amino group. The substituted or unsubstituted amino group is not particularly limited, but an unsubstituted amino group is preferred from the viewpoint of the reactivity with the epoxy resin. As the guest compound, adamantylamine, such as 1-adamantylamine, is preferred.

The content of the supramolecular inclusion body is 0.1 part by mass or more and 4.0 parts by mass or less with respect to 100 parts by mass of the epoxy resin. When the content of the supramolecular inclusion body falls within the range, an excellent decrease in viscosity is obtained, and high-strength adhesion at a small thickness can be achieved. Meanwhile, when the content of the supramolecular inclusion body is less than the lower limit, the effect of the supramolecular inclusion body is reduced, and there is a risk in that an adhesion surface may be peeled off. In addition, when the content of the supramolecular inclusion body is more than the upper limit, there is a risk of an increase in viscosity.

The composition containing the epoxy adhesive and the supramolecular inclusion body is obtained by adding a predetermined amount of a powdery supramolecular inclusion body to an epoxy adhesive, stirring the mixture, and performing centrifugation as required. For the centrifugation, a small ultracentrifuge, a planetary rotary stirring defoamer, or the like may be used.

The light shielding blade of the present disclosure is preferably used in an optical path opening/closing mechanism portion that is required to have vibration damping properties and heat resistance as an optical component. Now, a camera and a focal plane shutter are described as examples.

(Camera)

Figure 7:
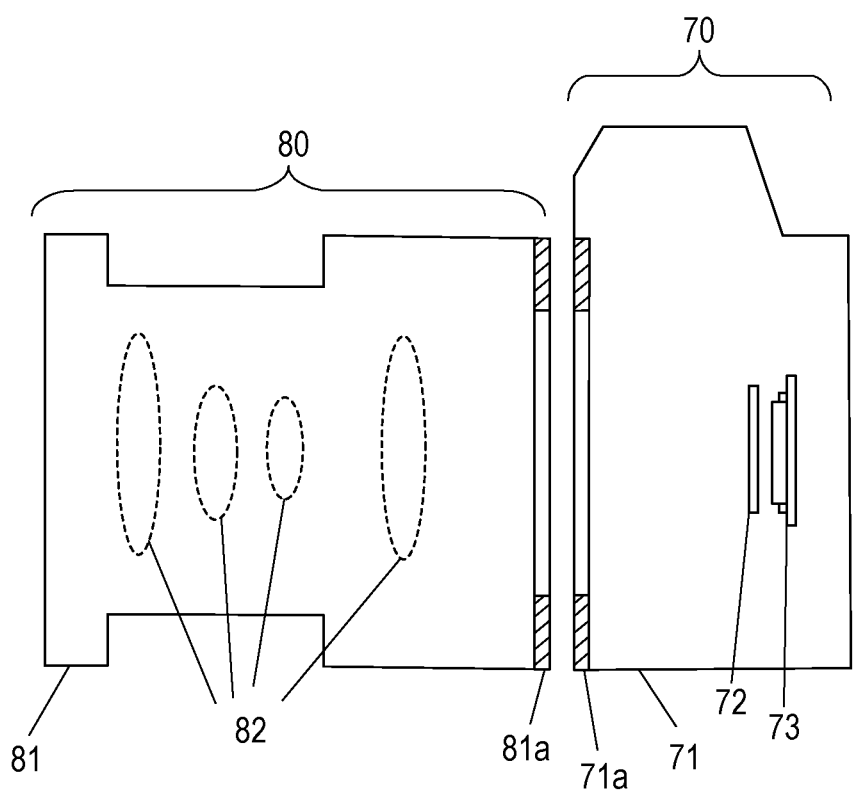
FIG. 7 is an explanatory view for illustrating a schematic configuration of a camera including a shutter blade.

FIG. 7 is an explanatory view for illustrating a schematic configuration of a camera including a shutter blade. The camera is, for example, a digital single-lens reflex camera, and includes a camera main body 70 that is an image pickup apparatus main body and an interchangeable lens (lens barrel) 80 that can be attached to and detached from the camera main body 70. In FIG. 7, the interchangeable lens 80 is mounted on the camera main body 70. The camera main body 70 includes a housing 71, and a shutter 72 (shutter blade) and an image pickup element 73 arranged in the housing 71.

The interchangeable lens 80 includes a housing 81 that is an interchangeable lens housing, and an image pickup optical system 82 arranged in the housing 81 and configured to form an optical image on a light receiving surface of the image pickup element 73 when the housing 81 (interchangeable lens 80) is mounted on the housing 71.

The housing 81 has a lens-side mount 81a having an opening formed therein, and the housing 71 has a camera-side mount 71a having an opening formed therein. When the lens-side mount 81a and the camera-side mount 71a are fitted to each other, the interchangeable lens 80 (housing 81) is mounted on the camera main body 70 (housing 71).

(Focal Plane Shutter)

Figure 8:
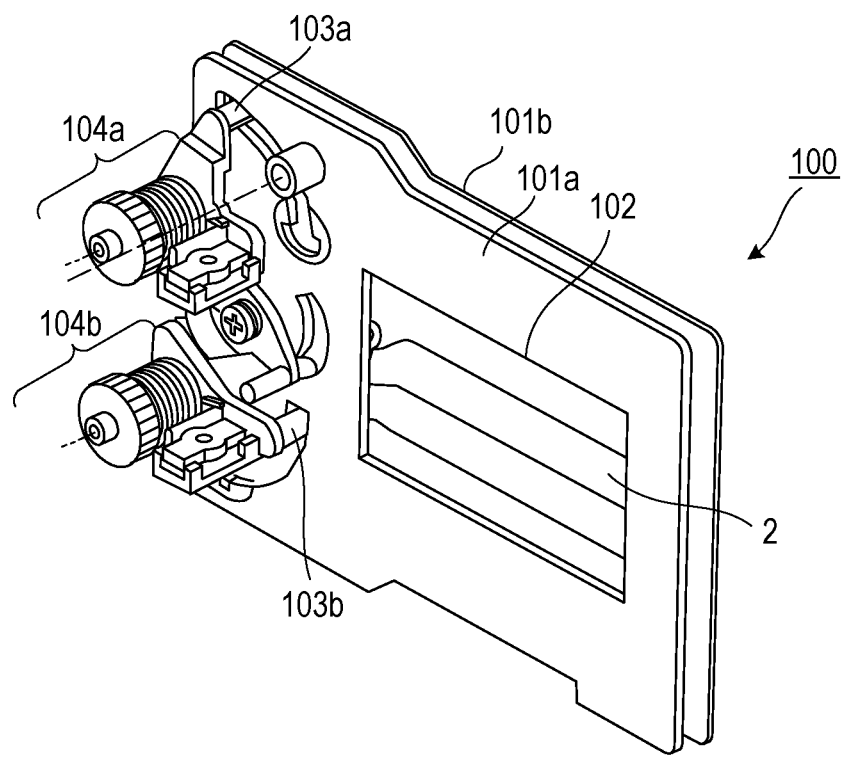
FIG. 8 is a perspective view for illustrating a configuration of a focal plane shutter including a shutter blade.

FIG. 8 is a perspective view for illustrating a focal plane shutter 100 including the shutter blade 1 of FIG. 1. The focal plane shutter 100 includes a base plate 101a and a cover plate 101b opposed to each other at an interval, each having an exposure window 102, and a blade mechanism portion (shutter blade 1 of FIG. 1) arranged between the base plate 101a and the cover plate 101b. In FIG. 8, part of the light shielding blades 2 of the blade mechanism portion is visible from the exposure window 102 of the base plate 101a. The base plate 101a includes a blade drive mechanism 104a configured to drive the blade arm 3a illustrated in FIG. 1 and a blade drive mechanism 104b configured to drive the blade arm 3b illustrated in FIG. 1. The blade drive mechanism 104a is connected to the blade arm 3a of FIG. 1 through intermediation of a blade drive pin 103a, and can rotate the blade arm 3a in conjunction with the movement of the blade drive mechanism 104a. Similarly, the blade drive mechanism 104b is connected to the blade arm 3b of FIG. 1 through intermediation of a blade drive pin 103b, and can rotate the blade arm 3b in conjunction with the movement of the blade drive mechanism 104b. Through rotation of the blade arm 3a and the blade arm 3b, the opening/closing operation of the exposure window 102 by the light shielding blade 2 is performed.

EXAMPLES

Now, the light shielding blade of the present disclosure is described by way of Examples, but the present disclosure is not limited to these Examples.

Example 1

A thin laminate of an aluminum alloy, an epoxy-based adhesive layer, and an aluminum alloy was produced through use of an aluminum alloy plate having a thickness of 0.05 mm as a metal base material and an epoxy-based adhesive having a thickness of 0.01 mm as a resin layer. The production was performed in the order of the following steps (1) to (4), and vibration characteristics were evaluated. Now, the steps (1) to (4) are described in detail.

(1) Rolling Step

An aluminum alloy plate was obtained by pressing down an aluminum alloy plate (A2024-0 material) having a thickness of 0.25 mm, a width of 100 mm, and a length of 200 mm to a thickness of 0.05 mm through cold rolling.

(2) Cleaning Step

The surface of the aluminum alloy plate obtained in the step (1) was cleaned as described below until a pure water contact angle became 40° or less.

Degreasing step: A substrate is immersed in a 4 vol % aqueous solution of SemiClean M-4 (nonionic surfactant), and ultrasonic cleaning is performed for 5 minutes.

Rinsing step: The substrate is taken out and appropriately washed with a running water shower of pure water.

Drying step: The surface of the substrate is dried by blowing off water droplets on the surface of the substrate with an air blow.

Surface activation: The surface of the substrate is activated by irradiating the surface of the substrate with ultraviolet rays for 5 minutes with a UV cleaning device.

(3) Adhesion Step

An epoxy-based adhesive manufactured by Tesk Co., Ltd. was used as an adhesive. An adhesive in which an epoxy resin "C1163-A" serving as a main agent and an aliphatic amine "C1163-B" serving as a curing agent were mixed at a ratio of 2:1 (mass ratio) was produced, and the adhesive was substantially uniformly applied to the aluminum alloy plate so that an application thickness became 10 μm after curing.

A laminated structure plate of the aluminum alloy plate, the epoxy-based adhesive layer, and the aluminum alloy plate was left to be cured on a hot plate at 100° C. for 60 minutes under a state in which a load of 3 kg was applied to the laminated structure plate from above, to thereby obtain a laminate.

(4) Press Punching Step

The laminate obtained in the step (3) was punched into an evaluation test piece shape through use of a thin plate precision shearing die in a direction in which a rolling direction was aligned with a major axis. Through use of the thin plate precision shearing die, a shear surface length becomes 70% or more of the plate thickness, and punching burrs can be suppressed.

Through use of the sample obtained as described above, the amplitude was determined by the following evaluation method for vibration characteristics, and the results are shown in Table 2.

[Evaluation Method for Vibration Characteristics]

Figure 5:
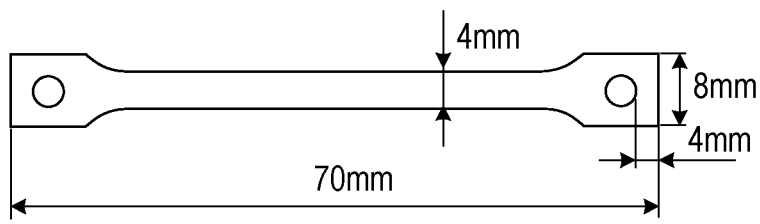
FIG. 5 is a view for illustrating a sample shape used in evaluation of vibration characteristics of a light shielding blade in Examples.

A sample shape for which vibration characteristics are evaluated is illustrated in FIG. 5. The sample has a dumbbell shape having a total length of 70 mm, a wide width portion of 8 mm, and a narrow width portion of 4 mm, and has through holes of φ3.1 mm at positions of 4 mm from both ends.

Figure 6:
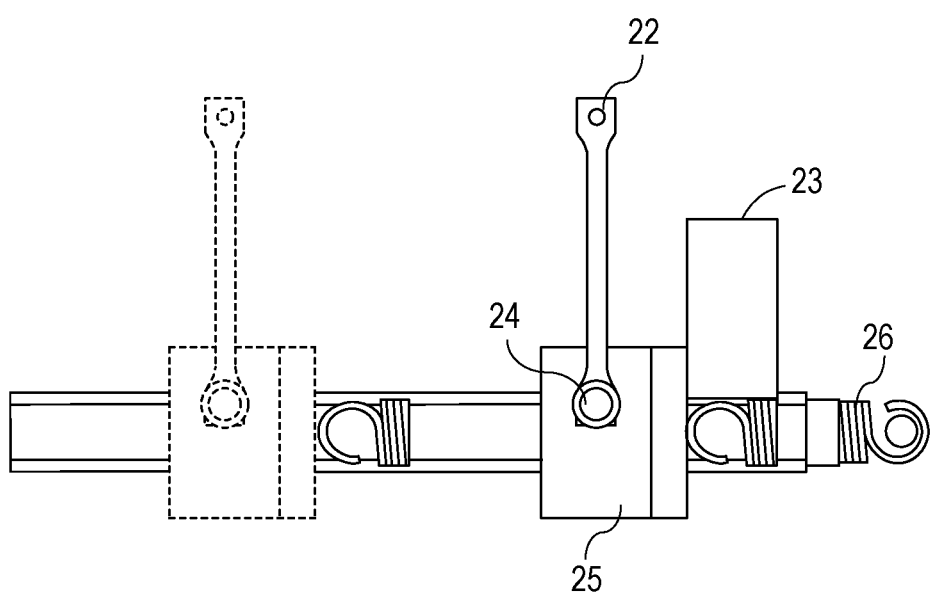
FIG. 6 is a schematic view of an evaluation device used in evaluation of the vibration characteristics of the light shielding blade in Examples.

A schematic view of an evaluation device used for evaluating the vibration characteristics is illustrated in FIG. 6. A test piece 22 is fixed to an aluminum bracket 25 installed on a slider provided in a substantially linear shape with a fixing screw 24 of φ3 mm. The aluminum bracket 25 was caused to collide with a urethane rubber stopper 23 having a Shore (A) hardness of 90°, and the amplitude in this case was measured with a laser displacement meter. The sampling period was set to 1 ms, and the maximum amplitude at initial collision was evaluated. The measurement position of the test piece 22 was set to a longitudinal position of 50 mm from the fixing screw 24 under a state in which the test piece 22 was placed on a measuring device, and the central portion of the test piece 22 in a width direction was measured. The moving distance of the aluminum bracket 25 was set to 40 mm, and the initial tensile load applied by a tension coil spring 26 in this case was set to 6 N.

Example 2

β-Cyclodextrin containing 20 methoxy groups and 1 amino group and 1-adamantylamine were placed in a 50 mL recovery flask containing a stirrer at a molar ratio of 1:1, and water was added to the mixture. After heating and stirring the mixture through use of a hot water bath, the obtained solution was removed from the hot water bath and returned to room temperature, followed by filtration. The obtained filtrate was dried to obtain a supramolecular inclusion body.

The supramolecular inclusion body was weighed with a precision balance in an amount of 3.0 parts by mass with respect to 100 parts by mass of the epoxy resin serving as a main agent of the epoxy adhesive used in Example 1, and placed in a 100 ml tube for a centrifuge. After that, the epoxy adhesive was poured into the tube. The supramolecular inclusion body and the epoxy adhesive were lightly stirred with a spatula. Then, the tube was set in a small ultracentrifuge (CS150GX, manufactured by Hitachi Koki Co., Ltd.), and centrifugal treatment was performed at 13,000 rpm for 1 hour, to thereby uniformly disperse the supramolecular inclusion body in the epoxy adhesive.

A test piece was produced by the same method as in Example 1 except that the epoxy adhesive containing the supramolecular inclusion body was used, and the vibration characteristics were evaluated. The results are shown in Table 2.

Example 3

A laminate was produced by the same method as in Example 2 except that the thickness of the epoxy-based adhesive layer was set to 0.003 mm, and a test piece was produced by the same method as in Examples 1 and 2, and the vibration characteristics were evaluated. The results are shown in Table 2.

Example 4

A laminate was produced by the same method as in Example 1 except that the thickness of the epoxy-based adhesive layer was set to 0.065 mm, and a test piece was produced by the same method as in Example 1, and the vibration characteristics were evaluated. The results are shown in Table 2.

Comparative Example 1

Through use of an aluminum alloy plate obtained by pressing down an aluminum alloy plate (A2024-0 material) having a thickness of 0.25 mm, a width of 100 mm, and a length of 200 mm to a thickness of 0.1 mm through cold rolling, a test piece was produced in the same manner as in Example 1, and the vibration characteristics were evaluated. The results are shown in Table 2. In the press punching step, the sheared surface length is set to 70% or more of the plate thickness, and punching burrs are suppressed.

Comparative Example 2

A test piece was produced in the same manner as in Comparative Example 1 except that an aluminum alloy plate pressed down to a thickness of 0.05 mm through cold rolling was used, and the vibration characteristics were evaluated. The results are shown in Table 2.

TABLE 2

| | Thickness of metal base material [µm] | Resin layer Thickness [µm] | Supra-molecular inclusion complex | Elastic modulus [GPa] | Initial amplitude [mm] |
|---|---|---|---|---|---|
| Example 1 | 50 × 2 | 10 | Absent | 3.0 | 0.457 |
| Example 2 | 50 × 2 | 10 | Present | 2.9 | 0.241 |
| Example 3 | 50 × 2 | 3 | Present | 2.9 | 0.456 |
| Example 4 | 50 × 2 | 65 | Absent | 3.0 | 0.190 |
| Comparative Example 1 | 100 × 1 | — | — | — | 1.890 |
| Comparative Example 2 | 50 × 1 | — | — | — | 2.329 |

It is understood from Table 2 that the light shielding blades of Examples each have a small initial amplitude of 0.5 mm or less and have a vibration suppressing effect as compared to the light shielding blades of Comparative Examples.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A light shielding blade comprising:
   a laminate in which a resin layer is sandwiched between two metal base materials,
   wherein at least one of the two metal base materials have a specific rigidity of $20 \times 10^6$ [Pa·m$^3$/kg] or more and a specific bending rigidity of 1.0 [Pa$^{1/3}$·m$^3$/kg] or more,
   wherein the resin layer is a cured product of a composition containing at least an epoxy resin and a crosslinking curing agent, and
   wherein the composition contains a supramolecular inclusion body in an amount of 0.1 part by mass or more and 4.0 parts by mass or less with respect to 100 parts by mass of the epoxy resin.

2. The light shielding blade according to claim 1, wherein the supramolecular inclusion body is formed of a cyclodextrin derivative and a guest compound,
   wherein the cyclodextrin derivative has an alkoxy group and a substituted or unsubstituted amino group, and
   wherein the guest compound has a substituted or unsubstituted amino group.

3. The light shielding blade according to claim 2, wherein the cyclodextrin derivative is a compound in which at least part of hydroxy groups of cyclodextrin are each substituted with one of the alkoxy group and the amino group.

4. The light shielding blade according to claim 3, wherein the cyclodextrin derivative is a compound in which a plurality of the hydroxy groups of cyclodextrin are each substituted with the alkoxy group.

5. The light shielding blade according to claim 2, wherein the alkoxy group is a methoxy group.

6. The light shielding blade according to claim 2, wherein the amino group of the cyclodextrin derivative is an unsubstituted amino group.

7. The light shielding blade according to claim 2, wherein the amino group of the guest compound is an unsubstituted amino group.

8. The light shielding blade according to claim 2, wherein the guest compound is 1-adamantylamine.

9. The light shielding blade according to claim 1, wherein a total thickness of the two metal base materials together is 20 μm to 150 μm.

10. The light shielding blade according to claim 1, wherein the resin layer has a thickness of 3 μm or more.

11. The light shielding blade according to claim 1, wherein the resin layer has an elastic modulus of 5 GPa or less.

12. The light shielding blade according to claim 1, wherein the two metal base materials each have a density of $5.0 \times 10^6$ [kg/m$^3$] or less.

13. The light shielding blade according to claim 1, wherein the resin layer has an elastic modulus of 1 GPa or more.

14. The light shielding blade according to claim 1, wherein the resin layer has a thickness of 65 μm or less.

15. An image pickup apparatus comprising:
a housing having an opening;
an image pickup element arranged in the housing;
a light shielding blade according to claim 1,
wherein the light shielding blade is arranged between the opening and the image pickup element in the housing.

16. The image pickup apparatus according to claim 15, wherein the image pickup element is a full size.

17. The image pickup apparatus according to claim 15, which further comprises a blade drive mechanism for turning the light shielding blade, wherein the blade drive mechanism drives the light shielding blade at 1/8000 second or less.

* * * * *